(12) United States Patent
Sartor et al.

(10) Patent No.: US 9,176,361 B2
(45) Date of Patent: Nov. 3, 2015

(54) OPTICAL ANALOG TO DIGITAL CONVERTER AND METHOD

(71) Applicant: Sony Corporation, Minato-ku (JP)

(72) Inventors: Piergiorgio Sartor, Fellbach (DE); Klaus Zimmermann, Neckartenzlingen (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/588,511

(22) Filed: Jan. 2, 2015

(65) Prior Publication Data

US 2015/0261065 A1 Sep. 17, 2015

(30) Foreign Application Priority Data

Mar. 11, 2014 (EP) .................................... 14158892

(51) Int. Cl.
| | | |
|---|---|---|
| *H03M 1/00* | (2006.01) | |
| *G02F 7/00* | (2006.01) | |
| *H03M 1/36* | (2006.01) | |
| *H03M 1/12* | (2006.01) | |

(52) U.S. Cl.
CPC ............... *G02F 7/00* (2013.01); *H03M 1/1245* (2013.01); *H03M 1/361* (2013.01)

(58) Field of Classification Search
CPC ... G02F 7/00; H03M 1/1245; H03M 2201/51; H03M 1/361
USPC .......................................... 341/137, 155, 156
See application file for complete search history.

(56) References Cited

U.S. PATENT DOCUMENTS

| | | | | |
|---|---|---|---|---|
| 4,926,177 | A * | 5/1990 | Sakata .......................... | 341/137 |
| 4,928,007 | A * | 5/1990 | Furstenau et al. ............. | 341/137 |
| 6,188,342 | B1 | 2/2001 | Gallo | |
| 8,050,351 | B2 * | 11/2011 | Cho et al. ....................... | 375/295 |
| 8,476,571 | B2 | 7/2013 | Grazioso et al. | |
| 2006/0239173 | A1 | 10/2006 | Zhang et al. | |
| 2008/0129564 | A1* | 6/2008 | Kitayama et al. ............. | 341/137 |
| 2011/0102873 | A1* | 5/2011 | Wada .......................... | 359/204.1 |

OTHER PUBLICATIONS

U.S. Appl. No. 14/591,324, filed Jan. 7, 2015, Sartor, et al.

(Continued)

*Primary Examiner* — Jean B Jeanglaude
(74) *Attorney, Agent, or Firm* — Oblon, McClelland, Maier & Neustadt, L.L.P.

(57) ABSTRACT

An optical analog to digital converter including a light source, a driver, an array of single photon avalanche diodes, and control circuitry. The light source emits photons. The driver receives an analog input signal and to drive the light source on the basis of the analog input signal. The array of single photon avalanche diodes detects the photons provided by the light source. The control circuitry is coupled to the array of single photon avalanche diodes and activates the array of single photon avalanche diodes for a predetermined time interval such that the array of single photon avalanche diodes detects the photons provided by the light source during the predetermined time interval. The control circuitry further determines the number of single photon avalanche diodes of the array of single photon avalanche diodes which detected a photon during the predetermined time interval.

20 Claims, 2 Drawing Sheets

(56) References Cited

OTHER PUBLICATIONS

Cristiano Niclass et al. "Design and Characterization of a CMOS 3-D Image Sensor Based on Single Photon Avalanche Diodes", IEEE Journal of Solid-State Circuits, vol. 40, No. 9, 2005, 8 pages.

Samuel Burri et al. "Jailbreak Imagers: Transforming a Single-Photon Image Sensor into a True Random Number Generator.", Int. Image Sensor Workshop (IISW), 2013, 4 pages.

* cited by examiner

OPTICAL ANALOG TO DIGITAL CONVERTER AND METHOD

The present application claims priority to European Patent application 14 158 892.1, filed in European Patent Office on Mar. 11, 2014, the entire contents of which being incorporated herein by reference.

TECHNICAL FIELD

The present disclosure generally pertains to an optical analog to digital converter and a method for optically converting an analog input signal into a digital output signal.

TECHNICAL BACKGROUND

Generally, analog to digital converters are known which convert an analog input signal to a digital output signal. Known analog to digital converters can be built as flash converts which have an array of comparators which simultaneously compares the analog input signal against an array of thresholds and outputs a bit string. The bit string can be encoded into a "number" by an encoder circuit, thereby obtaining a digital output signal. The resolution, i.e. the bit depth, can be increased by increasing the number of comparators. The speed of this type of analog to digital converter basically depends on the speed of the comparators used.

For increasing the speed and resolution it is known to implement such analog to digital flash converters in parallel, to interleave the acquisition process and to use fast, analog sample-and-hold circuits in order to sample the analog input signal faster than it is the case for a single analog to digital converter. For such parallel analog to digital converter implementations performances of 12 bit at 2 Giga-samples per second are known.

Although there exist analog to digital converters, it is generally desirable to improve the conversion of analog signals to digital signals and respective analog to digital converters.

SUMMARY

According to a first aspect the disclosure provides an optical analog to digital converter. The optical analog to digital converter comprises a light source configured to emit photons, a driver configured to receive an analog input signal and to drive the light source on the basis of the analog input signal, an array of single photon avalanche diodes configured to detect the photons provided by the light source, and a control coupled to the array of single photon avalanche diodes. The control is configured to activate the array of single photon avalanche diodes for a predetermined time interval such that the array of single photon avalanche diodes detects photons provided by the light source during the predetermined time interval, and to determine the number of single photon avalanche diodes of the array of single photon avalanche diodes which detected a photon during the predetermined time interval.

According to a second aspect the disclosure provides a method for optically converting an analog input signal into a digital output signal. The method comprises receiving an analog input signal, driving a light source configured to emit photons on the basis of the received analog input signal, activating an array of single photon avalanche diodes for a predetermined time interval such that the array of single photon avalanche diodes detects photons provided by the light source during the predetermined time interval, and determining the number of single photon avalanche diodes of the array of single photon avalanche diodes which detected a photon during the predetermined time interval.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1:
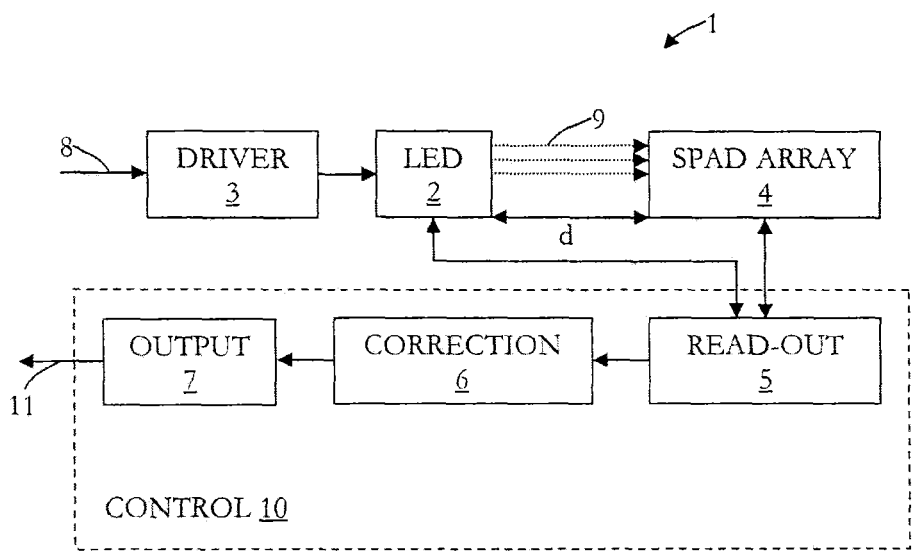
FIG. 1 schematically illustrates an optical analog to digital converter.

Before a detailed description of the embodiments under reference of FIG. 1, general explanations are made.

An optical analog to digital converter comprises a light source configured to emit photons, a driver configured to receive an analog input signal and to drive the light source on the basis of the analog input signal, an array of single photon avalanche diodes configured to detect the photons provided by the light source, and a control coupled to the array of single photon avalanche diodes. The control is configured to activate the array of single photon avalanche diodes for a predetermined time interval such that the array of single photon avalanche diodes detects photons provided by the light source during the predetermined time interval. The control is also configured to determine the number of single photon avalanche diodes of the array of single photon avalanche diodes which detected a photon during the predetermined time interval.

The number of single photon avalanche diodes of the array of single photon avalanche diodes which detected a photon during the predetermined time interval can be determined directly or indirectly.

For the direct determination the number of single photon avalanche diodes of the array of single photon avalanche diodes which detected a photon during the predetermined time interval can be counted, for example. For the indirect determination the number of single photon avalanche diodes of the array of single photon avalanche diodes which did not detect a photon during the predetermined time interval can be counted, for example, and the number of single photon avalanche diodes of the array of single photon avalanche diodes which detected a photon during the predetermined time interval can be derived by subtracting the number of single photon avalanche diodes of the array of single photon avalanche diodes which did not detect a photon during the predetermined time interval from the total number of single photon avalanche diodes included in the array of single photon avalanche diodes.

The light source can comprise e.g. a glow filament, a light emitting diode (also referred to as "LED" hereinafter), a laser diode, a fluorescent lamp or other light units. The light source can be a high-speed light source, e.g. a high speed light emitting diode or laser diode and can be configured to emit photons at a specific wavelength or in a specific range of wavelengths, which can be adapted, for example, to the sensitivity of the single photon avalanche diodes.

The light source is tuned in some embodiments. The driver can be configured to receive an (electric) analog input signal and to drive the light source on the basis of the analog input signal. For instance, the intensity of the light source can depend on the analog input signal, e.g. on a level of the analog input signal. For example, a lower voltage level of the analog input signal causes a lower intensity of the light source and a higher voltage level of the analog input signal causes a higher intensity of the light source. The higher the intensity of the light source is the more photons are emitted in a predetermined time interval. Hence, in some embodiments, the voltage level of the analog input signal is proportional or disproportionate to the intensity of the light source, i.e. to the number of photons emitted in a predetermined time interval. This means, in some embodiments the intensity linearly increases with the level of the analog input signal, while in other embodiments the intensity quadratically, exponential or the like increases. Also a mixture is possible, in the sense that the intensity (basically) linearly increases until a threshold is reached and upon exceeding of the threshold the intensity increases in a non-linear manner, etc.

The array of single photon avalanche diodes includes multiple single photon avalanche diodes (also referred to as "SPAD" hereinafter). A SPAD can be a solid-state photodetector (on semiconductor basis) in which a photo-generated carrier can trigger an avalanche current due to the impact ionization mechanism. In some embodiments, a SPAD can detect low intensity signals, as it can detect single photons and each SPAD can output the arrival time of the detected photon. The SPADS can output the arrival times of the photons detected with a jitter of typically a few tens of picoseconds.

SPADs exploit similarly to avalanche photodiodes an avalanche current of a reverse biased p-n junction to detect an incident photon. SPADs can be specifically designed to operate with a reverse-bias voltage which is above the breakdown voltage, similarly as it is the case for the Geiger counter. This operation mode is therefore also called "Geiger mode" in analogy with the Geiger counter. As SPADs and also SPAD arrays are, in general, known to the skilled person, a more detailed description of them is omitted hereinafter.

The array of SPADS (also referred to as "SPAD array" hereinafter) can include at least two SPADS, but it can also include more than two, e.g. 2 times 2 (i.e. 4), 4 times 4 (i.e. 16), 2 times 4 (i.e. 8), or any other amount of SPADS. The SPADs can be arranged in rows and columns in the SPAD array, wherein the rows can be horizontally arranged and the columns can be vertically arranged.

The SPAD array is located in a predefined distance to the light source, wherein the distance can be fixed such that the photons emitted from the light source travel a constant distance to the single SPADs of the SPAD array. The SPAD array can have a plane shape and can be arranged such that it is vertical with respect to the ground, without that the present disclosure is limited to a vertical arrangement. The light source can have a diameter that is (much) larger than the diameter of the SPAD array, such that all photons emitted from the light source basically arrive in a parallel manner at the SPAD array and such that all photons travel basically the same distance between the light source and the SPAD array.

Each SPAD outputs a detection signal upon detection of a photon. The detection signal can include a time value, but it can also include (only) a binary value which indicates that a (one or more) photon is detected by the respective SPAD. In some embodiments, the SPAD array can also include a number or a coordinate which is indicative for the specific SPAD which detected the photon.

The optical analog to digital converter comprises a control coupled to the array of single photon avalanche diodes. In the following, the functionality of the control is described. However, the following description fully applies to embodiments pertaining to a method for optically converting an analog input signal to a digital output signal, e.g. with the optical analog to digital converter described herein.

The control can comprise a processor, a microprocessor, a CPU or the like and it can also comprise other units, which are also explained below under reference of FIG. 1.

The SPAD array can be coupled to the control over a single data line, through which all detection signals of the single SPADs can be transmitted to the control. Alternatively, all SPADs of the SPAD array can be coupled with an own data line to the control. In still other embodiments, also a mixture of data line connection is implemented. For example, each row of SPADs of the SPAD array is coupled via an own line to the control, etc. The detection signals transmitted by the SPAD array can be analog and/or digital. Moreover, the control can receive, i.e. "read-out", the detection signals of the SPADs of the SPAD array serial or parallel. In some embodiments also a mixture of serial and parallel read-out is realized, e.g. by parallel reading out SPADs of each row of the SPAD array, but reading out one row of SPADs after the other, i.e. in a serial manner, etc.

As mentioned, the control is configured to activate the array of single photon avalanche diodes for a predetermined time interval such that the array of single photon avalanche diodes detects photons provided by the light source during the predetermined time interval and to determine the number of single photon avalanche diodes of the array of single photon avalanche diodes which detected a photon during the predetermined time interval.

Hence, during the activation of the SPAD array during the predetermined time interval, the SPAD array detects the photons emitted from the light source. As discussed, the intensity of the light source, i.e. the number of photons emitted per time interval and, thus, the number of photons detected per predetermined time interval, is indicative of the analog input signal or a level of the analog input signal, e.g. indicative of the voltage level of the analog input signal. In some embodiments, it is ensured that (basically) not more than one photon incidents onto a single SPAD, such that the number of single photon avalanche diodes of the array of single photon avalanche diodes which detected a photon during the predetermined time interval (basically) corresponds to the number of photons which incident onto the SPAD array, and, in turn, the number of photons which incident onto the SPAD array (basically) corresponds to the number of photons emitted by the light source (photon loss, e.g. due to scattering or the like is neglected as well as the fact that the detection probability of a photon which incidents on a SPAD is typically lower than 100 percent, as the detection probability of the SPADs of the SPAD array is assumed to be (basically) equal).

Thereby, a level of the analog input signal is mapped to a number of photons/number of SPADs which detected a photon. The number of SPADs which detected a photon can be transformed into a respective bit value representing the level of the analog input signal during the predetermined time interval.

The activation of the array of single photon avalanche diodes and the determination of the number of SPADs which detected a photon can be performed periodically, for example at a sample rate of several Megahertz or Gigahertz, without limiting the scope of the present disclosure in that regard.

The resolution of the digital output signal depends on the number of SPADs included in the SPAD array. For example, a SPAD array with 32 times 32 single SPADs, i.e. 1024 SPADs in summary, can achieve a resolution of 10 bit, while a SPAD array with 256 times 256 single SPADs, i.e. 65.536 SPADs in summary, can achieve a resolution of 16 bit.

The optical arrangement provides a converter with galvanic isolation (electrical isolation) since the light source and the SPAD array are only optically coupled to each other. Hence, in some embodiments, there is no need to additionally use optically coupled (or, in general, galvanic isolated) front end amplifiers.

The control can be configured to output a digital (output) signal on the basis of the determined number of SPADs which detected a photon. Hence, per predetermined time interval a respective bit value is determined, as discussed above, thereby generating a bit stream which is a digital output signal. The digital output signal can be generated in any format and the present disclosure is not limited to a specific digital signal.

In some embodiments, the control is configured to correct the output digital signal. For example, in cases where the intensity of the light source is not direct proportional to the level of the analog input signal, the control can correct the digital output signal by compensating the non-linear behavior of the relationship between the intensity of the light source (i.e. the number of detected photons) and the level of the analog input signal.

Additionally, in some embodiments, the control is configured to detect a malfunction of a SPAD of the SPAD array and can correct the digital output signal by taking the malfunction of the respective SPADs into account.

In some embodiments, the control is configured to activate a first subset of single photon avalanche diodes of the array of single photon avalanche diodes and simultaneously determine the number of single photon avalanche diodes of a second subset of single photon avalanche diodes of the array of single photon avalanche diodes which detected a photon during a previous time interval. The first subset of SPADs can be, for example, a first half of all SPADs of the SPAD array and the second subset of SPADs can be, for example, a second half of the SPADs of the SPAD array. Of course, the first and second subsets can be based on any division of the SPADs of the SPAD array. For instance, the first subset can include 40, 30, 20, etc. percent of the SPADs of the SPAD array while the second subset can include 60, 70, 80, etc. percent of the SPADs of the SPAD array. This mode of the optical analog to digital converter can also be referred to as "interleaving mode", since the activation of the first subset of SPADs and the read-out of the second subset of SPADs is temporally interleaved (at least partially). Hence, in a first time interval, the first subset of SPADs is activated, while for the second subset of SPADs the number of SPADs is determined, which detected photons during a time interval before the first time interval. In a second time interval, after the first time interval, the second subset of SPADs is activated, while for the first subset of SPADs the number of SPADs is determined, which detected photons during the first time interval, etc. In this interleaving mode the resolution is reduced, e.g. to the half in the case that each of the first and second subsets of SPADs includes a half of the SPADs of the SPAD array, but the speed can be increased. For instance, assuming that the SPADs have a certain dead time during which they are not able to detect further photons. Then, the dead time of the first set of subsets of SPADs can be used for activating the second subset of SPADs and vice versa, thereby increasing the speed of the optical analog to digital converter. The present disclosure is not limited to two subsets of SPADs, but also more subsets can be used and the interleaving of the activation and determination can be accordingly adapted. For instance, in the case of three subsets, a first subset can be activated, while a second subset is read-out and a third subset of SPADs is reset during a first time interval. In a second time interval, the first subset is read-out, the second subset is reset and the third subset is activated. In a third time interval, the first subset is reset, the second subset is activated and the third subset is reset, etc.

As also mentioned above, in some embodiments, the driver is configured to drive the intensity of the light source on the basis of the analog input signal, e.g. on the basis of a level, such as a voltage level, of the analog input signal.

Moreover, in some embodiments, the driver is configured to adapt a driving range of the light source to a voltage range (voltage level range) of the analog input signal. For example, the driver can map a minimum voltage level of the analog input signal to a minimum intensity value of the light source and a maximum voltage level of the analog input signal to a maximum intensity value of the light source. In some embodiments, (only) a maximum intensity level of the light source is adapted to a maximum level of the analog input signal.

As mentioned, the number of photons emitted from the light source is proportional to the intensity of the light source. Depending on the intensity and, for example, on the sample rate which is related to the length of the predetermined time interval and/or the number of SPADs included in the SPAD array, the driver can map or adjust a maximum level of the analog input signal to a respective maximum intensity value, for which it can be ensured that the probability that two or more photons incident on the same SPAD is small (i.e. below a certain threshold).

As mentioned, in some embodiments, the control is further configured to detect a malfunction of a single photon avalanche diode, for example on the basis of the detection signals transmitted upon detection of photons. The malfunction can be detected, for example, by monitoring a timer for each SPAD and determining, whether the SPAD detects a photon in a predetermined time interval. In the case that a SPAD does not detect a photon after a predefined time, the respective SPAD can be identified as defect. Additionally or alternatively, a test circuit provided in each SPAD or in the SPAD array can be driven, which tests the functionality of the SPADs. In some embodiments also the light source can be tuned and controlled by the control and, for example, for testing the SPAD array, the intensity of the light source can be increased such that all SPADs of the SPAD array will receive photons in a predetermined time interval. Thereby, SPADs which do not detect any photon within the predetermined time interval can be identified as defect. On the other hand, the light source can be turned off such that no photons are emitted, whereby defect SPADs can be identified which transmit a photon detection signal although no photons can be detected, since the light source does not emit any photons.

In some embodiments, the control is further configured to generate a notification in the case of a detected malfunction of a single photon avalanche diode. The notification can include an electronic signal, e.g. an audio signal, a message signal which is displayed on a display or the like.

The control can further be configured to selectively control the single photon avalanche diodes of the array of single photon avalanche diodes. For example, the resolution of the optical analog to digital converter can be adjusted by turning on/off single SPADs of the array of SPADs, thereby adjusting the number of SPADs which can detect a photon in the predetermined time interval and thereby adjusting the resolution.

The procedures discussed above can also be performed in embodiments pertaining to a method for optically converting an analog input signal into a digital output signal. Accordingly, the explanations as made above fully apply to the following description of embodiments of methods for optically converting an analog input signal into a digital output signal.

In some embodiments the method for optically converting an analog input signal into a digital output signal comprises receiving an analog input signal, driving a light source configured to emit photons on the basis of the received analog input signal, activating an array of single photon avalanche diodes for a predetermined time interval such that the array of single photon avalanche diodes detects photons provided by the light source during the predetermined time interval, and determining the number of single photon avalanche diodes of the array of single photon avalanche diodes which detected a photon during the predetermined time interval, as discussed above in detail.

The method can further comprise outputting a digital signal on the basis of the determined number of SPADs which have detected a photon during the predetermined time interval, as discussed above.

The method can further comprise correcting the output digital signal, as discussed above.

The method can further comprise activating a first subset of single photon avalanche diodes of the array of single photon avalanche diodes and simultaneously determining the number of single photon avalanche diodes of a second subset of single photon avalanche diodes of the array of single photon avalanche diodes which detected a photon during a previous time interval, as discussed above.

The method can further comprise driving the intensity of the light source on the basis of the analog input signal, as discussed above.

The method can further comprise adapting a driving range of the light source to a voltage range of the analog input signal, as discussed above, wherein a maximum intensity level of the light source is adapted to a maximum level of the analog input signal.

As discussed above, in some embodiments the activation of the array of single photon avalanche diodes for a predetermined time interval and the determination of the number of SAPDs of the array of single photon avalanche diodes which detected a photon during the predetermined time interval can be periodically repeated.

As discussed, the single photon avalanche diodes of the array of single photon avalanche diodes can be read-out in parallel in some embodiments.

Returning to FIG. 1, there is illustrated an embodiment of an optical analog to digital converter 1 which converts an electric analog input signal 8 with the aid of a tuned light emitting diode LED 2 as a light source to a digital output signal 11.

Although in the present embodiment one LED 2 is used, the present invention is not limited in that regard and it can be used also two or more LEDs.

The analog input signal 8 is input into a driver 3 having high input impedance and which drives the LED 2. The driver 3 gains the analog input signal 8 and adapts a voltage level range of it to a respective intensity range of the LED 2 and the driver 3 drives the LED 2 accordingly.

The LED 2 generates photons 9 which are detected by an array of single photo avalanche diodes 4, referred to as SPAD array 4 hereinafter. LED 2 is arranged in a predefined distance "d" from SPAD array 4.

The LED 2 has a diameter which is much larger than the SPAD array 4 such that it can be assumed, as an approximation in the present embodiment, that the photons 9 incident nearly parallel on the SPAD array 4. The SPAD array 4 has multiple SPADs (single photon avalanche diodes) which are arranged in an array, i.e. in rows and columns. In the present embodiment, the SPAD array 4 has 32 times 32 SPADs, i.e. 1024 pixels, wherein each pixel corresponds to one SPAD. The detection area of each of the SPADs of the SPAD array 4 faces in the direction of the LED 2 and, thus, in the direction of the incident photons 9. In the present embodiment only one SPAD array 4 is provided, but the skilled person will appreciate that also two or more SPAD arrays can be used and the present disclosure is not limited in that regard.

Furthermore, in order to improve speed, in some embodiments, it is possible to trade off spatial resolution with temporal one. In some embodiments, the SPAD requires a dead time "t" from photon acquisition to be ready to acquire a second photon. In this case a subset of SPADs can be used during a first part of the dead time and another subset can be used during a second part of the dead time. For example, 50% of the SPADs of the SPAD array 4 can be used in order to acquire data at a certain instant in time (e.g. first half of the "dead time" t), and then, "t/2" later, the other 50% of SPADs of the SPAD array 4 can be used (which were in the process of being re-armed and were "locked" during the first half t/2 of the dead time, so not sensitive to photons). In this specific example the acquisition frequency is doubled and the bit resolution is halved. Of course, the present disclosure is not limited to this specific example.

For controlling of the optical analog to digital converter 1, a control 10 is provided, which comprises a read-out and timing unit 5, a digital correction unit 6, and a digital output 7. Please note that the division of the control 10 into units 5 to 7 is only made for illustration purposes and that the present invention is not limited to any specific division of functions in specific units. For instance, the control 10 could be implemented by a respective programmed processor, field programmable gate array (FPGA) and the like.

The read-out and timing unit 5 is coupled to the SPAD array 4 and receives photon detection signals generated by the SPADs of the SPAD array 4. It generates a respective clock and sample rate according to which SPAD array 4 is controlled and the detection signals of the SPAD array 4 are read-out. In the present example, the SPADs of the SPAD array 4 are read out in parallel.

Figure 2:
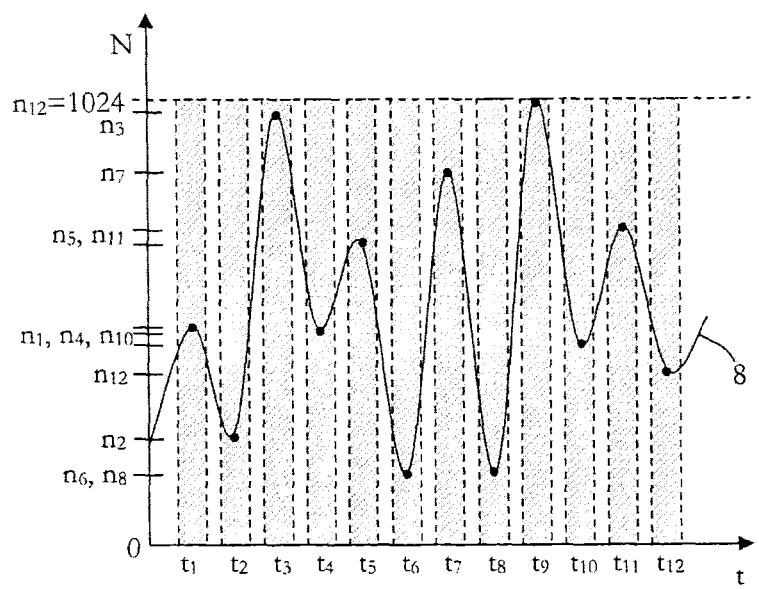
FIG. 2 schematically illustrates the analog to digital conversion.
Figure 3:
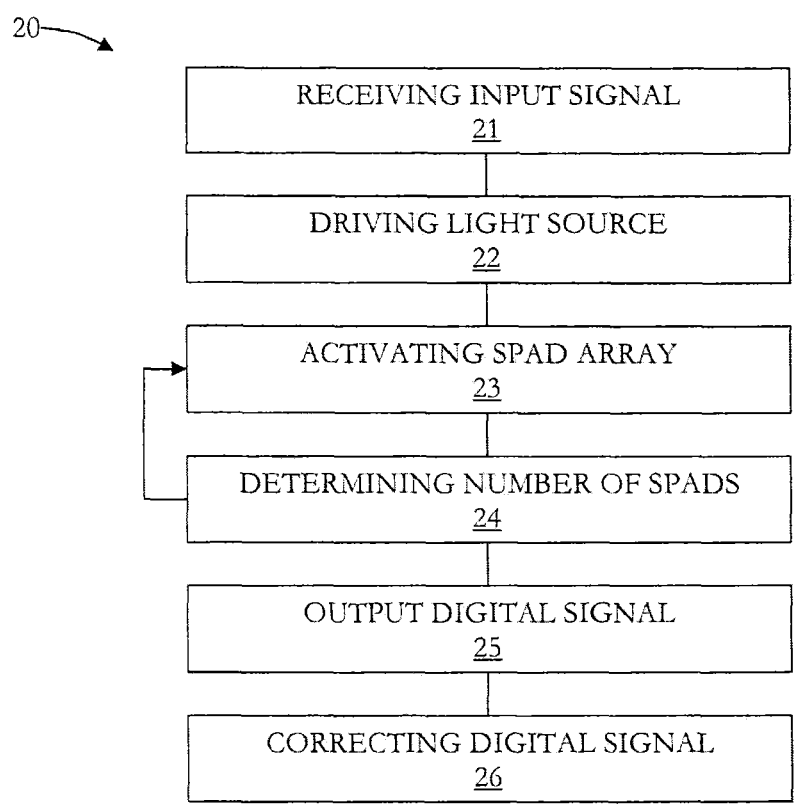
FIG. 3 illustrates a flow diagram of a method for optically converting an analog input signal into a digital output signal.

The read-out and timing unit 5 controls the SPAD array 4 in the following manner, which is also illustrated in FIGS. 2 and 3 which his described in more detail below. The read-out and timing unit 5 activates the SPAD array 4 for a predetermined time interval, such that it is able to detect photons 9 emitted from the LED 2 during the predetermined time interval. When the predetermined time interval is over, the read-out and timing unit 5 deactivates and locks the SPAD array 4, such that the SPAD array 4 does not further detect photons, but the status quo is "frozen", and it can be determined which of the SPADs of the SPAD array 4 were triggered, i.e. which of the SPADs of the SPAD array 4 detected a photon. This is accomplished by receiving the respective photon detection signals of each of the SPADs of the SPAD array 4 and, thereby, counting how many SPADs have been triggered by an incident photon. During the read-out time, the SPAD array 4 is deactivated. After the read-out of the SPAD array 4 is terminated and the number of SPADs which have been detected a photon has been determined, the SPAD array 4 can be activated again and the procedure is repeated.

Thereby, the voltage level of the analog input signal 8 is converted into a respective number of SPADs for each predetermined time interval. The number SPADs which detected a photon during the predetermined time interval can be transformed into a respective bit number, whereby the level of the analog input signal is converted into a digital number.

This procedure is also illustrated in FIG. 2, where the analog input signal 8 is exemplary shown. In this example, the voltage level of the analog input signal 8 is adjusted by the driver 3 to a voltage level range between 0 V and 1 V corresponding to an intensity range of the LED 2 which leads to a number of triggered "pixels", i.e. single SPADs, of the SPAD array 4 between 0 (none) and 1024 (all), i.e. a voltage level of 0 V corresponds to a number of 0 pixels, while a voltage level of 1 V corresponds to a number of 1024 pixels. The ordinate of FIG. 2 shows the number N of pixels of the SPAD array 4 which have been triggered by photons emitted by the LED 2 driven at a respective voltage level of the analog input signal 8 and the abscissa shows the time.

FIG. 2 also illustrates the predetermined time intervals $t_1$, $t_2, \ldots, t_{12}$ during which the SPAD array 4 is activated and the photons 9 emitted by the LED 2 are detected. Each of the time intervals $t_1, t_2, \ldots, t_{12}$ has the same length. Between the predetermined time intervals $t_1, t_2, \ldots, t_{12}$ the control 10, i.e. the read-out and timing circuit 5, counts how many pixels, i.e. single SPADs, of the SPAD array 4 have been triggered during the respective time interval $t_1, t_2, \ldots, t_{12}$. The number of pixels which were triggered during the respective time interval is marked as a data point in FIG. 2 and the respective number of triggered SPADs is labeled as $n_1, n_9, \ldots, n_{12}$ at the ordinate of FIG. 2.

The read-out and timing circuit 5 activates the SPAD array 4 for the first time interval $t_1$. After expiration of the first time interval $t_1$, the read-out and timing circuit 5 determines the number of SPADs which detected a photon during the first time interval $t_1$, which is in the example of FIG. 2 the number $n_1$. Then, the read-out and timing circuit 5 activates the SPAD array 4 for the second time interval $t_2$. After expiration of the second time interval $t_2$, the read-out and timing circuit 5 determines the number of SPADs which detected a photon during the second time interval $t_2$, which is in the example of FIG. 2 the number $n_2$, and so on.

During a time interval between two consecutive predetermined time intervals, e.g. during the time interval between the first $t_1$ and the second $t_2$ time interval, the SPAD array 4 is locked and deactivated such that it does not further detect photons, but can transmit the respective information which and/or how many SPADs have been triggered.

Of course, FIG. 2 is only for illustration purposes and the present disclosure is not limited to that specific example.

A SPAD is able, in some embodiments, to be driven in time intervals which are in the nanosecond region or even below, and a good resolution can be obtained.

The clock frequency of the clock signal generated by the read-out and timing unit 5 and, thus, the sample rate with which the analog input signal is sampled and converted to a digital output signal can be adapted in some embodiments, e.g. in response to a user input and/or in dependence on an intensity adjusted for the tuned LED 2. In the present example, the sample rate is about 1 GHz (without limiting the present disclosure in that regard).

In the case that a high intensity for the LED 2 is adjusted, the frequency of the clock signal could be increased in order to be able to dissolve different detected photons accordingly. The intensity of the LED 2 can be adjusted by the read-out and timing unit 5 which is also coupled to the LED 2. The read-out and timing circuit 5 can also adjust the intensity of the LED 2 in dependence of a deadtime of the SPADs of the SPAD array 4 in some embodiments. In the present embodiment, the SPADs of the SPAD array 4 have an identical or at least nearly identical dead time, such that the dead time of the SPADs of the SPAD array 4 can be neglected.

The read-out and timing unit 5 generates respective binary values, i.e. bits, as discussed above, representing, for example, the number of SPADs having been triggered, in turn representing the voltage level of the analog input signal 8 during the respective predetermined time interval, and it outputs a digital signal into the digital correction unit 6.

The digital correction unit 6 performs a digital correction in the present embodiment by compensating a non-linear behavior between the intensity of the LED 2 (and, thus, the associated number of SPADs detecting photons) and the voltage level of the analog input signal 8 and it linearizes the digital output signal which is fed after correction to the digital output unit 7.

The digital output unit 7 transforms the digital signal received from the digital correction unit 6 into a respective format which is adapted to a specific purpose and outputs it as a digital output signal 11.

The light source, such as LED 2, and the SPAD array 4 can be adapted to each other, such that, for example, the SPAD array 4 is driven at its maximum gain point and the LED 2 is driven at its maximum speed point. The maximum gain point of a SPAD typically depends on the energy, i.e. the wavelength of the incident photons. Thus, the combination of the light source and the SPAD array can be fine tuned with respect to the tradeoff between performance and costs.

In the embodiment of FIGS. 1 and 2 a resolution of 10 bit at 1 GHz is achieved. As also mentioned above, for example, when a SPAD array of 256 times 256 SPADs is used, a resolution of 16 bit can be achieved at, e.g. at 1 GHz, without that the present disclosure is limited in that regard and the skilled person will appreciated that the number of SPADs of the SPAD array as well as the sample rate can be adapted with respect to a specific task and purpose.

In the following, a method 20 for optically converting an analog input signal, such as analog input signal 8 of FIG. 1, to a digital output signal, such as digital output signal 11 of FIG. 1, is explained. Of course, the explanations made above also apply to the method 20.

At 21, the analog input signal is received, e.g. by the driver 3 as discussed above.

At 22, the light source, such as LED 2 above, is driven on the basis of a level of the received analog input signal, as discussed above.

At 23, an array of single photon avalanche diodes, such as SPAD array 4, is activated for a predetermined time interval such that it detects the photons provided by the light source during the predetermined time interval, as discussed above.

At 24, the number of single photon avalanche diodes of the array of single photon avalanche diodes is determined which detected a photon during the predetermined time interval and a respective digital output signal is generated at 25, which can be corrected at 26, as discussed above in detail.

As also discussed above in detail, method 20 can be periodically repeated at 23 and 24 as indicated by the respective arrow in FIG. 3.

Note that the present technology can also be configured as described below.

(1) An optical analog to digital converter, comprising:
    a light source configured to emit photons;
    a driver configured to receive an analog input signal and to drive the light source on the basis of the analog input signal;
    an array of single photon avalanche diodes configured to detect the photons provided by the light source; and
    a control coupled to the array of single photon avalanche diodes and configured to activate the array of single photon avalanche diodes for a predetermined time interval such that the array of single photon avalanche diodes detects photons provided by the light source during the predetermined time interval; and determine the number of single photon avalanche diodes of the array of single photon avalanche diodes which detected a photon during the predetermined time interval.

(2) The optical analog to digital converter of (1), wherein the control is further configured to output a digital signal on the basis of the determined number of single photon avalanche diodes of the array of single photon avalanche diodes which detected a photon during the predetermined time interval.

(3) The optical analog to digital converter of claim (2), wherein the control is further configured to correct the output digital signal.

(4) The optical analog to digital converter of anyone of (1) to (3), wherein the light source includes at least one of: a light emitting diode and a laser diode.

(5) The optical analog to digital converter of anyone of (1) to (4), wherein the control is configured to activate a first subset of single photon avalanche diodes of the array of single photon avalanche diodes and simultaneously determine the number of single photon avalanche diodes of a second subset of single photon avalanche diodes of the array of single photon avalanche diodes which detected a photon during a previous time interval.

(6) The optical analog to digital converter of anyone of (1) to (5), wherein the driver is configured to drive the intensity of the light source on the basis of the analog input signal.

(7) The optical analog to digital converter of anyone of (1) to (6), wherein the driver is configured to adapt a driving range of the light source to a voltage range of the analog input signal.

(8) The optical analog to digital converter of anyone of (7), wherein a maximum intensity level of the light source is adapted to a maximum level of the analog input signal.

(9) The optical analog to digital converter of anyone of (1) to (8), wherein the control is further configured to periodically activate the array of single photon avalanche diodes for a predetermined time interval such that the array of single photon avalanche diodes detects photons provided by the light source during the predetermined time interval; and determine the number of single photon avalanche diodes of single photon avalanche diodes which detected a photon during the predetermined time interval.

(10) The optical analog to digital converter of anyone of (1) to (9), wherein the single photon avalanche diodes of the array of single photon avalanche diodes are read-out in parallel.

(11) A method for optically converting an analog input signal into a digital output signal, comprising:

receiving an analog input signal; driving a light source configured to emit photons on the basis of the received analog input signal;

activating an array of single photon avalanche diodes for a predetermined time interval such that the array of single photon avalanche diodes detects photons provided by the light source during the predetermined time interval; and determining the number of single photon avalanche diodes of the array of single photon avalanche diodes which detected a photon during the predetermined time interval.

(12) The method of (11), further comprising outputting a digital signal on the basis of the determined number of single photon avalanche diodes of the array of single photon avalanche diodes which detected a photon during the predetermined time interval.

(13) The method of (12), further comprising correcting the output digital signal.

(14) The method of anyone of (11) to (13), wherein the light source includes at least one of: a light emitting diode and a laser diode.

(15) The method of anyone of (11) to (14), wherein a first subset of single photon avalanche diodes of the array of single photon avalanche diodes is activated and simultaneously the number of single photon avalanche diodes of a second subset of single photon avalanche diodes of the array of single photon avalanche diodes which detected a photon during a previous time interval is determined.

(16) The method of anyone of (11) to (15), further comprising driving the intensity of the light source on the basis of the analog input signal.

(17) The method of anyone of (11) to (16), further comprising adapting a driving range of the light source to a voltage range of the analog input signal.

(18) The method of anyone of (17), wherein a maximum intensity level of the light source is adapted to a maximum level of the analog input signal.

(19) The method of c anyone of (11) to (18), further comprising periodically activating the array of single photon avalanche diodes for a predetermined time interval such that the array of single photon avalanche diodes detects photons provided by the light source during the predetermined time interval; and determining the number of single photon avalanche diodes of the array of single photon avalanche diodes which detected a photon during the predetermined time interval.

(20) The method of anyone of (11) to (19), wherein the single photon avalanche diodes of the array of single photon avalanche diodes are read-out in parallel.

(21) A computer program comprising program code causing a computer to perform the method according to anyone of (11) to (20), when being carried out on a computer.

(22) A non-transitory computer-readable recording medium that stores therein a computer program product, which, when executed by a processor, causes the method according to anyone of (11) to (20) to be performed.

The invention claimed is:

1. An optical analog to digital converter, comprising:
a light source configured to emit photons;
a driver configured to receive an analog input signal and to drive the light source on the basis of the analog input signal;
an array of single photon avalanche diodes configured to detect the photons provided by the light source; and
control circuitry coupled to the array of single photon avalanche diodes and configured to
activate the array of single photon avalanche diodes for a predetermined time interval such that the array of single photon avalanche diodes detects the photons provided by the light source during the predetermined time interval; and
determine the number of single photon avalanche diodes of the array of single photon avalanche diodes which detected a photon during the predetermined time interval.

2. The optical analog to digital converter of claim 1, wherein the control circuitry is further configured to output a digital signal on the basis of the determined number of single photon avalanche diodes of the array of single photon avalanche diodes which detected a photon during the predetermined time interval.

3. The optical analog to digital converter of claim 2, wherein the control circuitry is further configured to correct the output digital signal.

4. The optical analog to digital converter of claim 1, wherein the light source includes at least one of: a light emitting diode and a laser diode.

5. The optical analog to digital converter of claim 1, wherein the control circuitry is configured to activate a first subset of single photon avalanche diodes of the array of single photon avalanche diodes and simultaneously determine the number of single photon avalanche diodes of a second subset of single photon avalanche diodes of the array of single photon avalanche diodes which detected a photon during a previous time interval.

6. The optical analog to digital converter of claim 1, wherein the driver is configured to drive the intensity of the light source on the basis of the analog input signal.

7. The optical analog to digital converter of claim 6, wherein the driver is configured to adapt a driving range of the light source to a voltage range of the analog input signal.

8. The optical analog to digital converter of claim 7, wherein a maximum intensity level of the light source is adapted to a maximum level of the analog input signal.

9. The optical analog to digital converter of claim 1, wherein the control circuitry is further configured to periodically
  activate the array of single photon avalanche diodes for the predetermined time interval such that the array of single photon avalanche diodes detects the photons provided by the light source during the predetermined time interval; and
  determine the number of single photon avalanche diodes of the array of single photon avalanche diodes which detected a photon during the predetermined time interval.

10. The optical analog to digital converter of claim 1, wherein the single photon avalanche diodes of the array of single photon avalanche diodes are read-out in parallel.

11. A method for optically converting an analog input signal into a digital output signal, comprising:
  receiving an analog input signal;
  driving a light source configured to emit photons on the basis of the received analog input signal;
  activating an array of single photon avalanche diodes for a predetermined time interval such that the array of single photon avalanche diodes detects the photons provided by the light source during the predetermined time interval; and
  determining the number of single photon avalanche diodes of the array of single photon avalanche diodes which detected a photon during the predetermined time interval.

12. The method of claim 11, further comprising outputting a digital signal on the basis of the determined number of single photon avalanche diodes of the array of single photon avalanche diodes which detected a photon during the predetermined time interval.

13. The method of claim 12, further comprising correcting the output digital signal.

14. The method claim 11, wherein the light source includes at least one of: a light emitting diode and a laser diode.

15. The method of claim 11, wherein a first subset of single photon avalanche diodes of the array of single photon avalanche diodes is activated and simultaneously the number of single photon avalanche diodes of a second subset of single photon avalanche diodes of the array of single photon avalanche diodes which detected a photon during a previous time interval is determined.

16. The method of claim 11, further comprising driving the intensity of the light source on the basis of the analog input signal.

17. The method of claim 16, further comprising adapting a driving range of the light source to a voltage range of the analog input signal.

18. The method of claim 17, wherein a maximum intensity level of the light source is adapted to a maximum level of the analog input signal.

19. The method of claim 11, further comprising periodically
  activating the array of single photon avalanche diodes for the predetermined time interval such that the array of single photon avalanche diodes detects the photons provided by the light source during the predetermined time interval; and
  determining the number of single photon avalanche diodes of the array of single photon avalanche diodes which detected a photon during the predetermined time interval.

20. The method of claim 11, wherein the single photon avalanche diodes of the array of single photon avalanche diodes are read-out in parallel.

* * * * *